United States Patent
Seta et al.

(10) Patent No.: US 6,987,066 B2
(45) Date of Patent: Jan. 17, 2006

(54) DRY ETCHING METHOD AND SEMICONDUCTOR DEVICE MANUFACTURING METHOD

(75) Inventors: Shoji Seta, Yokohama (JP); Hideo Ichinose, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 298 days.

(21) Appl. No.: 10/602,072

(22) Filed: Jun. 24, 2003

(65) Prior Publication Data

US 2004/0087169 A1 May 6, 2004

Related U.S. Application Data

(63) Continuation of application No. 09/739,905, filed on Dec. 20, 2000, now Pat. No. 6,607,986.

(30) Foreign Application Priority Data

Dec. 28, 1999 (JP) ............................................ 11-372006

(51) Int. Cl.
*H01L 21/426* (2006.01)

(52) U.S. Cl. ....................................... 438/710; 438/709
(58) Field of Classification Search ................. 438/710, 438/709

See application file for complete search history.

(56) References Cited

U.S. PATENT DOCUMENTS 6,168,726 B1  1/2001  Li et al.
6,284,149 B1  9/2001  Li et al.
6,312,874 B1  11/2001 Chan et al.
6,417,090 B1  7/2002  Wang et al.

FOREIGN PATENT DOCUMENTS

| JP | 5-226299 | 9/1993 |
|----|----------|--------|
| JP | 6-151302 | 5/1994 |
| JP | 7-74147 | 3/1995 |
| JP | 8-316209 | 11/1996 |
| JP | 10-125659 | 5/1998 |
| JP | 10-172960 | 6/1998 |
| JP | P2000-501573 A | 2/2000 |
| KR | 1998-036950 | 8/1998 |

OTHER PUBLICATIONS

"Notification of Reasons for Rejection," Japan Patent Office, Jan. 27, 2005.

*Primary Examiner*—Felisa Hiteshew
(74) *Attorney, Agent, or Firm*—Finnegan, Henderson Farabow, Garrett & Dunner, L.L.P.

(57) ABSTRACT

A dry etching method comprises sequentially laminating a first insulating layer containing carbon and a second insulating layer containing carbon on a substrate, patterning the second insulating layer to form a mask; forming grooves in the first insulating layer by etching the first insulating layer with the second insulating layer used as a mask such that each of the grooves has a side surface and a bottom surface in the first insulating layer; and removing the second insulating layer by use of a reactive gas containing carbon atoms and at least one of oxygen atoms, hydrogen atoms and nitrogen atoms.

20 Claims, 8 Drawing Sheets

DRY ETCHING METHOD AND SEMICONDUCTOR DEVICE MANUFACTURING METHOD

This is a continuation of application Ser. No. 09/739,905, filed Dec. 20, 2000 U.S. Pat. No. 6,607,986, which is incorporated herein by reference.

CROSS-REFERENCE TO RELATED APPLICATIONS

This application is based upon and claims the benefit of priority from the prior Japanese Patent Application No. 11-372006, filed Dec. 28, 1999, the entire contents of which are incorporated herein by reference.

BACKGROUND OF THE INVENTION

This invention relates to a dry etching method for eliminating a second insulating layer containing carbon atoms formed on a first insulating layer containing carbon atoms by use of activated reactive gas and a semiconductor device manufacturing method using the dry etching method.

A semiconductor device is required to have a more fine pattern with an increase in the integration density thereof. Further, an attempt is made to reduce an interconnection resistance and parasitic resistance in order to enhance the response speed.

In order to enhance the fine pattern technique of the semiconductor device, it is necessary to improve the resolution of a photoresist and it is effective to reduce the thickness of the photoresist in the development of the semiconductor device. Further, an antireflection layer is formed directly under a photoresist layer and the photoresist layer is patterned.

It is required to lower the interconnection parasitic capacitance in order to enhance the operation speed of the semiconductor device and a lowering in the dielectric constant (which is called Low-k layer) of an interlayer dielectric is studied. As the interlayer dielectric having a lowered dielectric constant, an organic based layer such as CF (fluorocarbon) based Teflon, a porous and relatively fragile inorganic layer such as an inorganic silicon oxide layer and an organic silicon oxide layer containing an organic component having carbon atoms in an inorganic layer can be given. The relative dielectric constant of the conventional oxide layer is approximately 4, but the relative dielectric constant of the above insulating layers is 3 or less. If an etching process is effected to form interconnection grooves and contact holes after a photoresist is patterned on the interlayer insulating layer, it is necessary to strip the photoresist in order to prepare for a case wherein an interconnection material or the like is filled in a later step.

In the conventional photoresist stripping method, a downflow ashing process for raising the wafer temperature to a high temperature of 200° C. or more and using process gas mainly containing oxygen gas is effected. In this method, the resist stripping process is realized by reacting carbon, oxygen, hydrogen atoms and the like in the photoresist with oxygen atoms in the active gas. It is considered that a reactive product obtained at this time contains $CO_2$, CO, $H_2O$ and the like, but in order to attain a sufficiently high stripping rate, a method for raising the temperature of the semiconductor substrate to 200° C. or more to enhance the reactivity is normally used.

However, in the conventional photoresist stripping method, if a multi-layered layer having a layer containing carbon atoms is formed as an underlying layer, the carbon atoms of the underlying layer react with oxygen atoms in the active gas and are removed. Therefore, if the underlying layer of the photoresist layer is a Teflon based organic layer (Low-k layer) of CF series, the underlying layer is etched when the photoresist is stripped and there occurs a problem that a critical dimension bias (CD bias) occurs. Further, if the underlying layer is a layer (organic silicon oxide layer) formed of an inorganic layer containing carbon atoms, a carbon atom removed layer is formed on the surface of the underlying layer and a problem that the relative dielectric constant is changed occurs. At this time, since the underlying layer from which the carbon atoms have been removed is contracted, there occurs a problem that not only the CD bias is changed but also a stress is applied, thereby causing a crack.

Further, as a gas dielectric structure, a structure having a carbon layer buried in a porous insulating layer used as the underlying layer is known. The structure is formed by sequentially effecting processes for stripping the photoresist after interconnection grooves and contact holes are formed in the carbon layer, then filling barrier metal and interconnection material therein, and effecting a CMP (Chemical Mechanical Polishing) step. However, in the conventional method, there occurs a problem that carbon atoms buried in the underlying layer are ashed at the time of stripping the photoresist, the underlying layer is partly removed and, as a result, the CD bias occurs.

BRIEF SUMMARY OF THE INVENTION

A dry etching method according to a first aspect of the invention comprises: sequentially laminating a first insulating layer containing carbon and a second insulating layer containing carbon on a substrate; patterning the second insulating layer to form a mask; forming grooves in the first insulating layer by etching the first insulating layer with the second insulating layer used as a mask such that each of the grooves has a side surface and a bottom surface in the first insulating layer; and removing the second insulating layer by use of a reactive gas containing carbon atoms and at least one of oxygen atoms, hydrogen atoms and nitrogen atoms.

A semiconductor device manufacturing method according to a second aspect of the invention comprises; sequentially laminating an insulating layer and a photoresist each containing carbon on a semiconductor substrate; patterning the photoresist to form a mask; forming interconnection grooves in the insulating layer by etching the insulating layer with the photoresist used as a mask such that each of the interconnection grooves has a side surface and a bottom surface in the insulating layer, ashing and removing the photoresist by use of a gas containing carbon atoms and at least one of oxygen atoms, hydrogen atoms and nitrogen atoms; and depositing a metal interconnection layer in the interconnection grooves to form interconnections therein.

A semiconductor device manufacturing method according to a third aspect of the invention comprises: sequentially laminating an insulating layer and a first photoresist on a semiconductor substrate; patterning the first photoresist to form a mask; forming first interconnection grooves by etching the insulating layer with the first photoresist used as a mask; ashing and removing the first photoresist by use of a gas containing carbon atoms and at least one of oxygen atoms, hydrogen atoms and nitrogen atoms; burying a carbon layer in the first interconnection grooves; laminating a second photoresist on the insulating layer to cover the carbon layer; patterning the second photoresist to form a mask; forming second interconnection grooves by etching the carbon layer with the second photoresist used as a musk such that each of interconnection grooves has a side surface and a bottom surface in the carbon layer; ashing and removing the second photoresist by use of a gas containing carbon atoms and at least one of oxygen atoms, hydrogen atoms and nitrogen atoms; depositing a metal interconnection layer in the second interconnection grooves to bury interconnections therein; forming a porous silicon oxide layer on the interlayer insulating layer to cover the interconnections and the carbon layer; and heating the carbon layer to remove the same from the interconnection grooves and provide a hollow around each of the interconnections.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
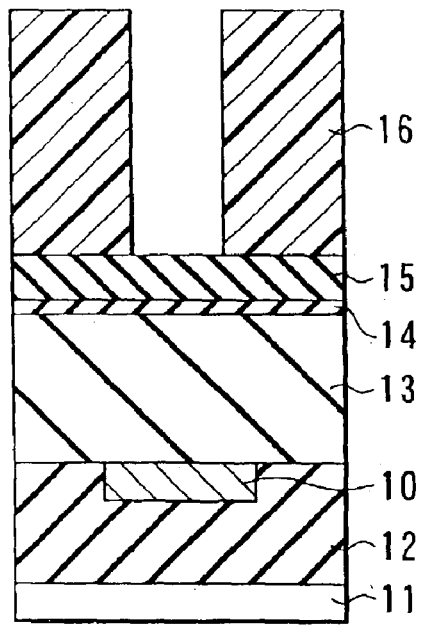
FIGS. 1A to 1E are cross sectional views of a semiconductor device showing the manufacturing method in the order of steps of manufacturing the semiconductor device according to a first embodiment of this invention.

There will now be described embodiments of this invention with reference to the accompanying drawings.

(First Embodiment)

A semiconductor device manufacturing method according to a first embodiment of this invention is explained with reference to FIGS. 1A to 1E. First, a low dielectric constant insulating layer (which is hereinafter referred to as an LKD layer) 12 with a film thickness 500 nm is formed by coating as an interlayer dielectric on a semiconductor substrate 11 formed of silicon semiconductor. A metal interconnection 10 such as an aluminum layer is buried in the surface portion of the LKD layer 12. An LKD layer 13 with a film thickness 400 nm is formed by coating as an interlayer dielectric on the LKD layer 12. The LKD layer 13 is formed of an organic silicon oxide layer such as a polysiloxane layer or benzocyclobutene (BCB) layer with the structure containing carbon atoms in an inorganic based layer.

In addition, the LKD layer may be formed of an inorganic silicon oxide layer which is formed of hydrogen-silsesquioxane or a CF based layer which is formed of poly (arylene) ether, parylene-AF4, polyimide, fluoropolymer, for example.

A modified layer 14 which is an oxide layer is formed by subjecting the semiconductor substrate (wafer) to an oxygen plasma process. An antireflection layer 15 formed of an organic material with a film thickness 60 nm and a photoresist 16 with a film thickness 0.6 $\mu$m are formed on the above layer. After this, the photoresist 16 is patterned by a lithography technique which is well known in the art (FIG. 1A).

Figure 1B:
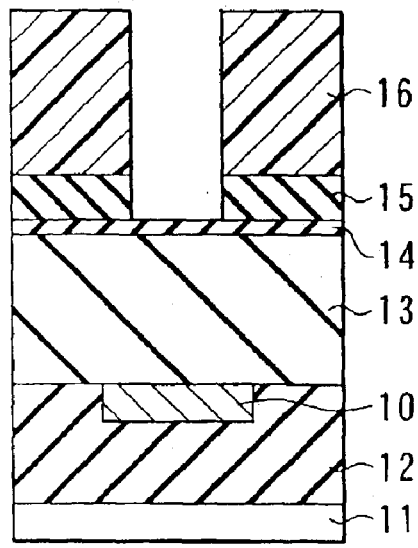
Figure 1C:
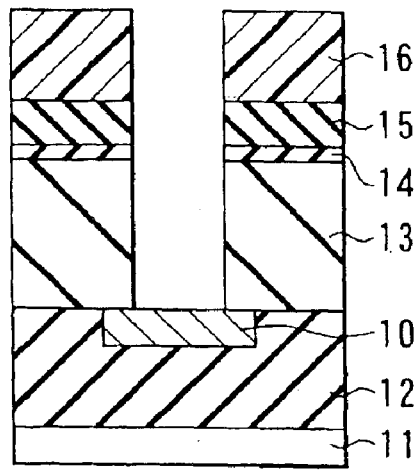

Next, the antireflection layer is etched with the patterned photoresist 16 used as a mask (FIG. 1B). Then, the modified layer 14 and LKD layer 13 are an etched by an RIE (reactive ion etching) method using an etching gas of $C_4F_8/CO/O_2/Ar$ to form a contact hole with a depth of 400 nm and a pattern size of 0.2 $\mu$m. On the bottom surface of the contact hole, the metal interconnection 10 buried in the LKD layer 12 is exposed (FIG. 1C).

Figure 1D:
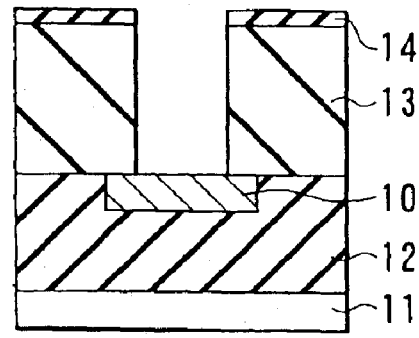
Figure 1E:
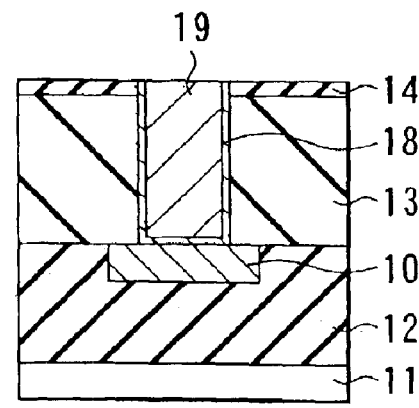

Next, portions of the photoresist 16 and antireflection layer 15 which are left behind on the LKD layer 13 are stripped (FIG. 1D). After this, a TiN barrier metal layer 18 is formed to a film thickness of approximately 30 nm on the modified layer 14 and the inner wall of the contact hole. Then, an aluminum (Al) layer 19 is formed to a film thickness of 700 nm by sputtering and filled in the contact hole. After this, the Al layer 19 is polished by a CMP method until the surface layer of the LKD layer 13 is exposed. Thus, the aluminum layer 19 used as a contact interconnection is formed in the contact hole. The aluminum layer 19 is used for electrically connecting an upper layer interconnection (not shown) of aluminum formed on the interlayer dielectric 13 later step to the metal interconnection (lower layer interconnection) 10 (FIG. 1E).

The metal interconnection used in this invention is not limited to aluminum. For example, Al—Si—Cu, Al—Cu, W, WSi, Cu, Ag, Au or the like can be used. Further, the above materials can be used for a contact interconnection for connecting the metal interconnections to each other. The interconnections can be formed of the same material or different materials. The materials can be freely selected by taking the characteristic of the semiconductor element and the like into consideration. In the first embodiment, the LKD layer is formed by coating but it can be formed by use of a CVD (Chemical vapor Deposition) method. Further, the contact hole is formed in this embodiment, but this invention can be applied when interconnections or other patterns are formed, for example.

Figure 2:
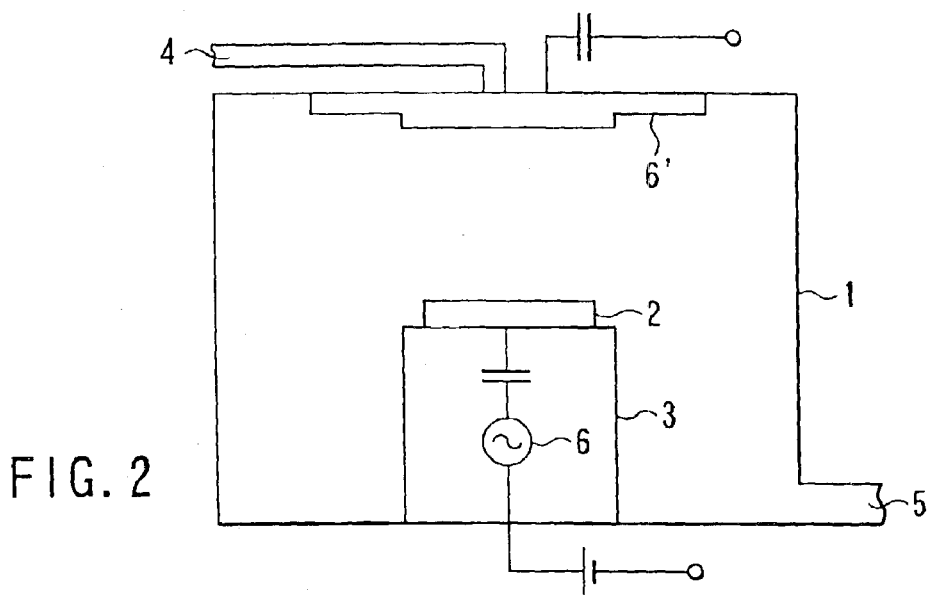
FIG. 2 is a schematic view of an ashing device used in the embodiment of this invention.

FIG. 2 is a cross sectional view schematically showing an ashing device. A mounting table 3 for mounting a to-be-processed object 2 such as a silicon wafer thereon is provided in a vacuum chamber 1. An opposite electrode 6' is provided in opposition to the mounting table 3. The mounting table 3 has a temperature adjusting mechanism so as to control the temperature of the to-be-processed object 2. On the ceiling wall of the vacuum chamber, a gas inlet pipe 4 is connected. Gas is introduced into the vacuum chamber via the gas inlet pipe 4 and the pressure is adjusted by use of a valve (not shown) of an exhaust port 5. After the pressure becomes stable, plasma is generated in the vacuum chamber by applying RF (Radio Frequency) power from an RF power source 6 disposed below the mounting table 3 so as to ash the to-be-processed object 2.

In the first embodiment, the ashing device of FIG. 2 is used, but this invention can use an ashing device having another plasma source. Further, an asher device (for example, downflow asher device (including an asher device using microwaves)) other than the plasma ashing device can be used.

In the first embodiment, for example, formation of the layer such as a photoresist containing carbon atoms is performed by a plasma process using a gas containing a new material containing oxygen atoms and carbon atoms. The ashing device is a parallel plate ashing device shown in FIG. 2 and the ashing condition is $O_2/CO=100/200$ ccm, 100 m Torr, 500 W, 30° C.

Figure 3:
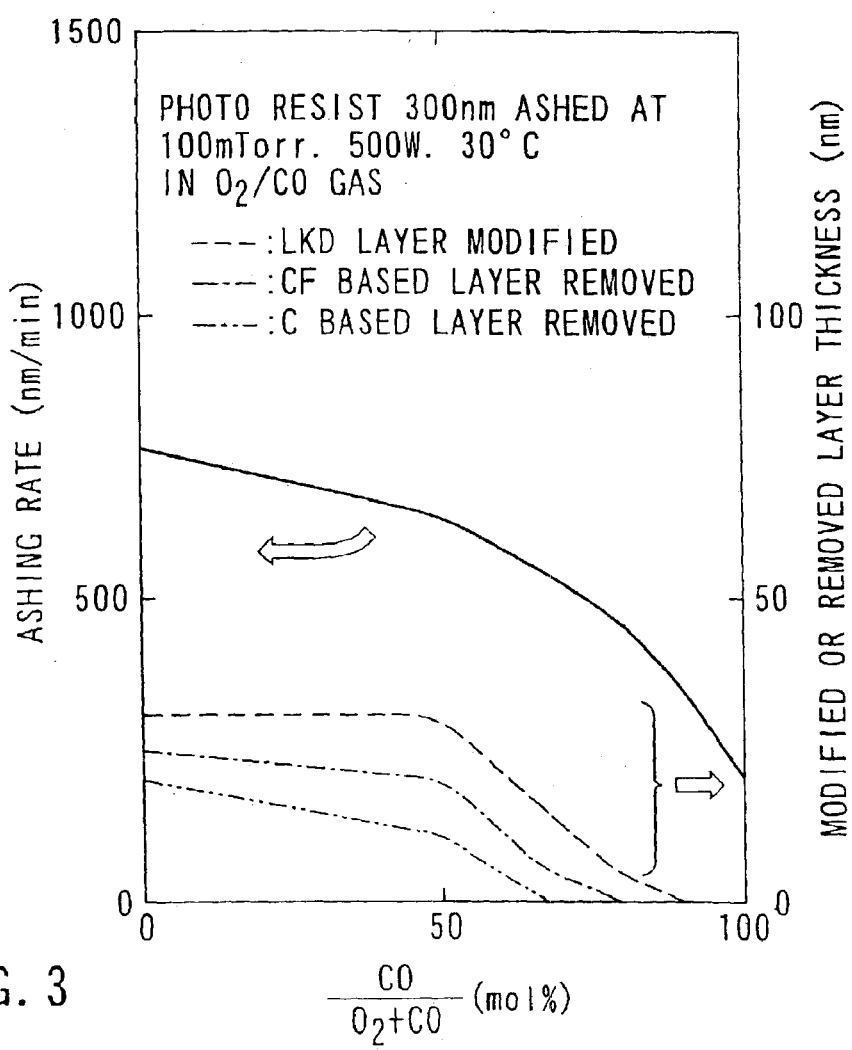
FIG. 3 is a characteristic diagram showing the relation between the photoresist ashing rate and the thickness of a modified layer or carbon removed layer on the side wall of the contact hole of the underlying layer at the time of ashing with respect to the gas composition ratio of an ashing gas having carbon monoxide contained in an oxygen gas.

In FIG. 3, the ordinate on the left side corresponds to a curve indicated by a solid line and indicates the ashing rate (nm/min) of the photoresist. The ordinate on the right side indicates the thickness (corresponding to a curve indicated by a dotted line) of a side wall modified layer of the LKD layer which is used as an underlying layer when the photoresist is ashed by 300 nm, the ordinate on the right side also indicates the thicknesses (nm) in cases wherein a CF based layer and C based layer are removed (respectively corresponding to curves indicated by a chain line and a chain double-dashed line). The abscissa indicates the CO concentration (mol %) ($CO/(O_2+CO)$) of ashing gas.

As shown in FIG. 3, if the condition other than the CO concentration of the ashing gas is set to the condition described above, the CF based layer is ashed and the CO concentration is set to 67% or more, then the etching rate is slightly lowered, but occurrence of the side etching can be prevented. The same effect can be attained in a case of the LKD layer and CF based layer.

Figure 4:
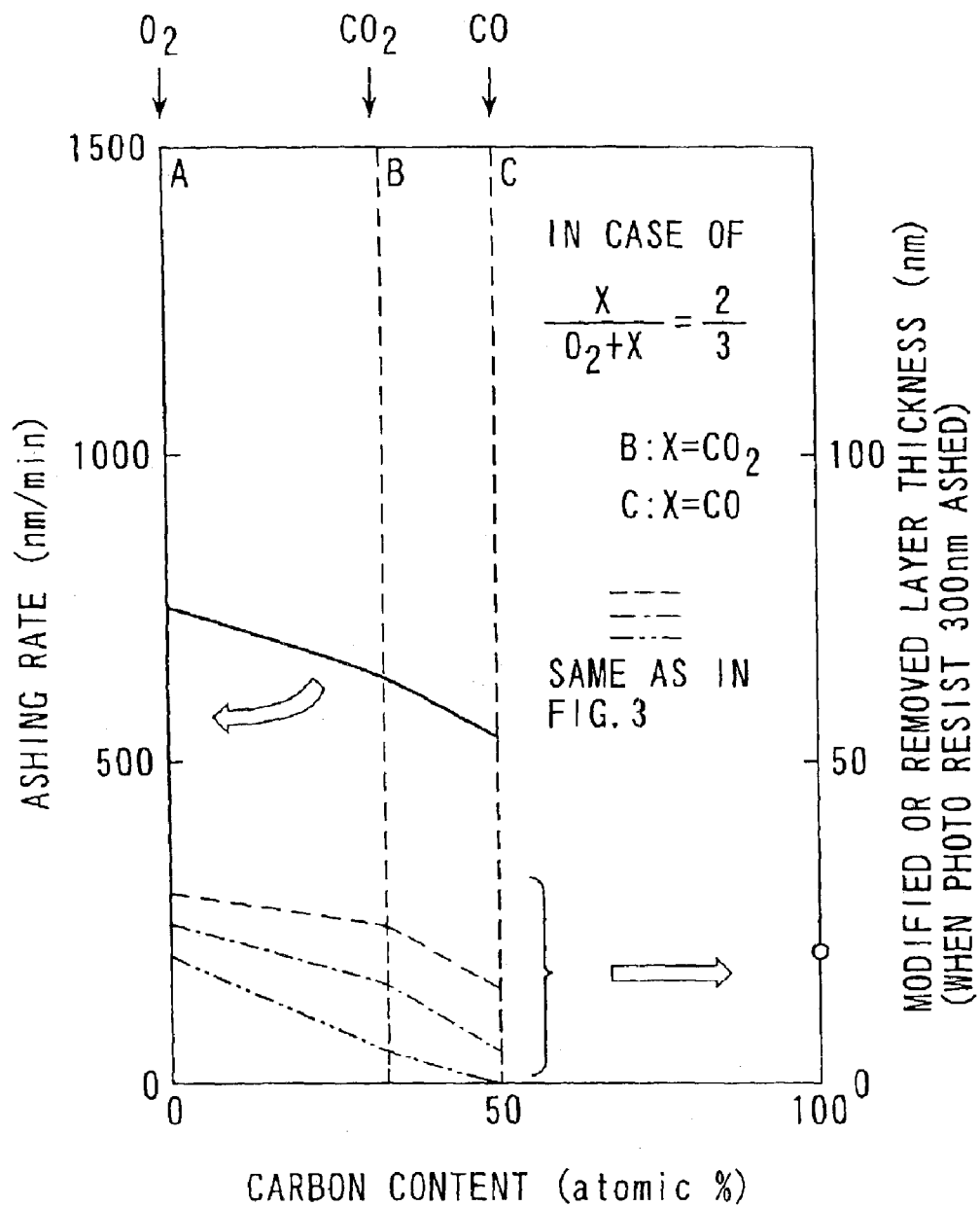
FIG. 4 is a characteristic diagram showing the relation between the photoresist ashing rate and the thickness of a modified layer or carbon removed layer on the side wall of the contact hole of the underlying layer with respect to the carbon atom density of an ashing gas.

FIG. 4 shows a case wherein CO in the ashing gas of FIG. 3 is replaced by $CO_2$ and a case wherein $O_2$ gas is independently used in comparison with a case wherein ($O_2+CO$) gas is used. The ordinate is defined in the same manner as in FIG. 3 and the abscissa indicates a carbon content (atomic %) of ashing gas formed of $O_2$ gas and x gas (in this case, $X/(O_2+X)=\frac{2}{3}$). In FIG. 4, the A point indicates a case wherein $O_2$ gas is independently used (conventional case), the B point indicates a case wherein $X=CO_2$ and the C point indicates a case wherein $X=CO$. Thus, in a process gas containing oxygen atoms and carbon atoms, the suppressing effect of the side etching is particularly high in a region in which the percentage of carbon atoms is $\frac{1}{3}$ or more of the percentage of oxygen atoms (in the right region with respect to the C point in FIG. 4). In the C point, C=30 is obtained based on $CO/(O_2+CO)=\frac{2}{3}$.

Further, in this invention, when oxygen gas is used as a component of ashing gas, the component does not mean that oxygen gas is exclusively used, but it is possible that the component may contain one or both of a nitrogen gas and a hydrogen gas.

Figure 5:
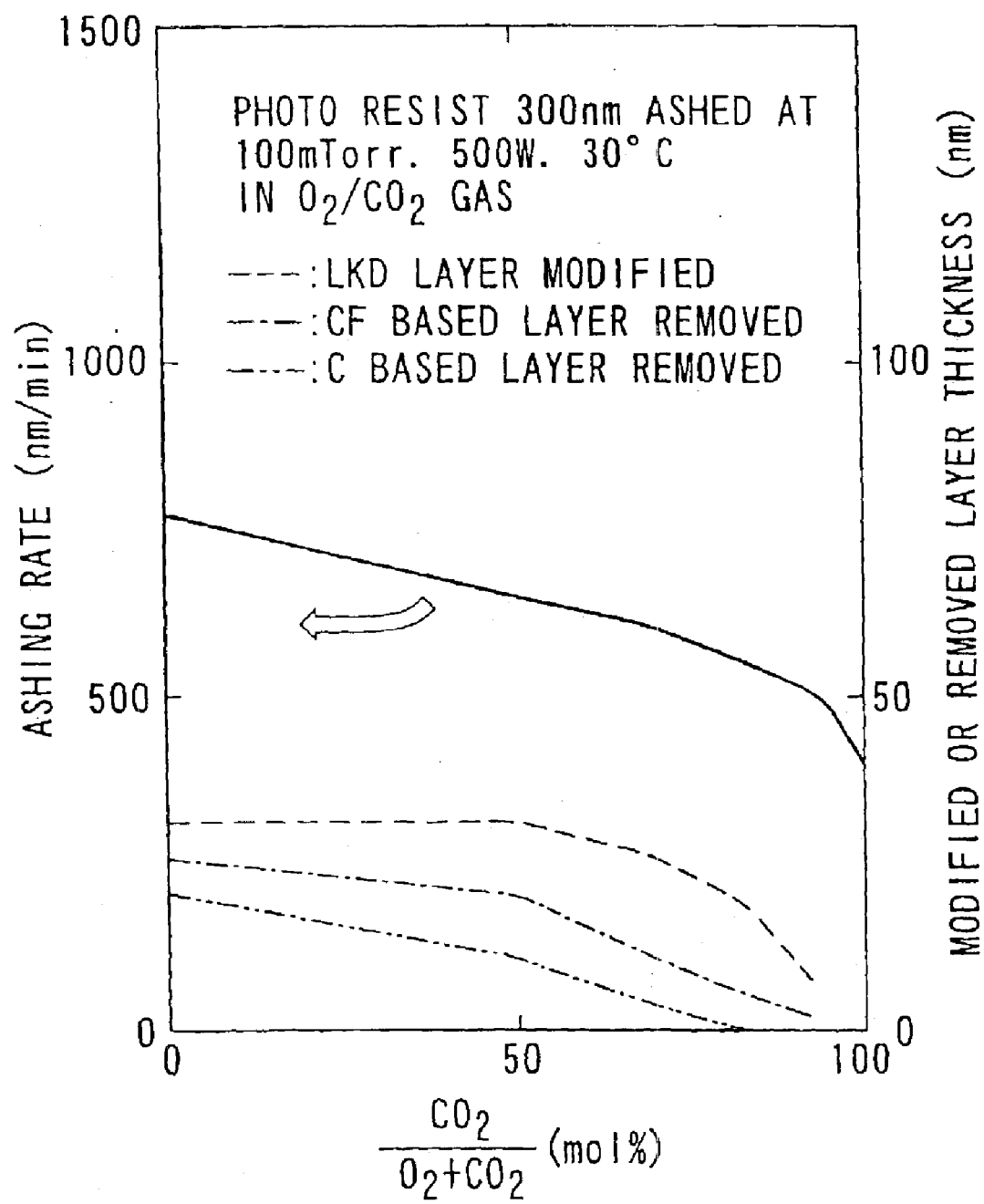
FIG. 5 is a characteristic diagram showing the relation between the photoresist ashing rate and the thickness of a modified layer or carbon removed layer on the side wall of the contact hole of the underlying layer at the time of ashing with respect to the gas composition ratio of an ashing gas containing carbon dixoide.

FIG. 5 is a characteristic diagram when a gas formed of $O_2$ and $CO_2$ is used as ashing gas. The ordinate is defined in the same manner as in FIG. 3 and the abscissa indicates the $CO_2$ concentration (mol %) ($CO_2/(O_2+CO_2)$) of the ashing gas. The effect is slightly lowered in comparison with the case of a CO gas due to a greater O content in a $CO_2$ gas, shown in FIG. 3, but if the $CO_2$ concentration of the ashing gas is set to 75% or more, the C based layer can be ashed without causing substantial side etching.

As shown in FIGS. 3 and 5, it is clearly understood that the same effect can be attained even when only CO gas or $CO_2$ gas is used without using oxygen gas (that is, even when CO or $CO_2$ is 100%). Therefore, in this invention, a gas consisting of $O_2$ and $CO_2$, a gas consisting of $O_2$ and CO, a CO gas or a $CO_2$ gas can be used as a gas containing oxygen atoms and carbon atoms.

After the process for forming holes in the LKD layer 13, the photoresist is stripped by the plasma ashing process independently using an oxygen gas in the conventional method, but in this case, there occurs a problem that carbon atoms are removed from the side wall of the LKD layer 13 and a modified layer (side wall carbon removed layer) is formed. The reason for this is considered as follows.

In the low pressure oxygen ashing, ion assisted etching of the photoresist due to an oxygen ion and oxygen radical occurs. At this time, an isotropic oxygen radical component enters the contact hole and carbon atoms are removed from a portion which is in contact with the radical. Further, spreading of the CD bias occurs by removal of carbon atoms from the layer.

Therefore, in the first embodiment, stripping of the photoresist 16 and antireflection layer 15 is effected by a plasma process using a gas containing oxygen atoms and carbon atoms. The ashing device is of a parallel plate type shown in FIG. 2 and the ashing condition is so set that the flow rate of $O_2$ is 30 ccm, the flow rate of CO is 270 ccm, the pressure is 100 m Torr, the power is 500 W and the temperature is 30° C. As shown in FIG. 3, in this condition, the process for stripping the photoresist proceeds, and since removal of carbon atoms from the side wall of the LKD layer can be prevented, formation of the side wall modified layer can be sufficiently suppressed.

Figure 6:
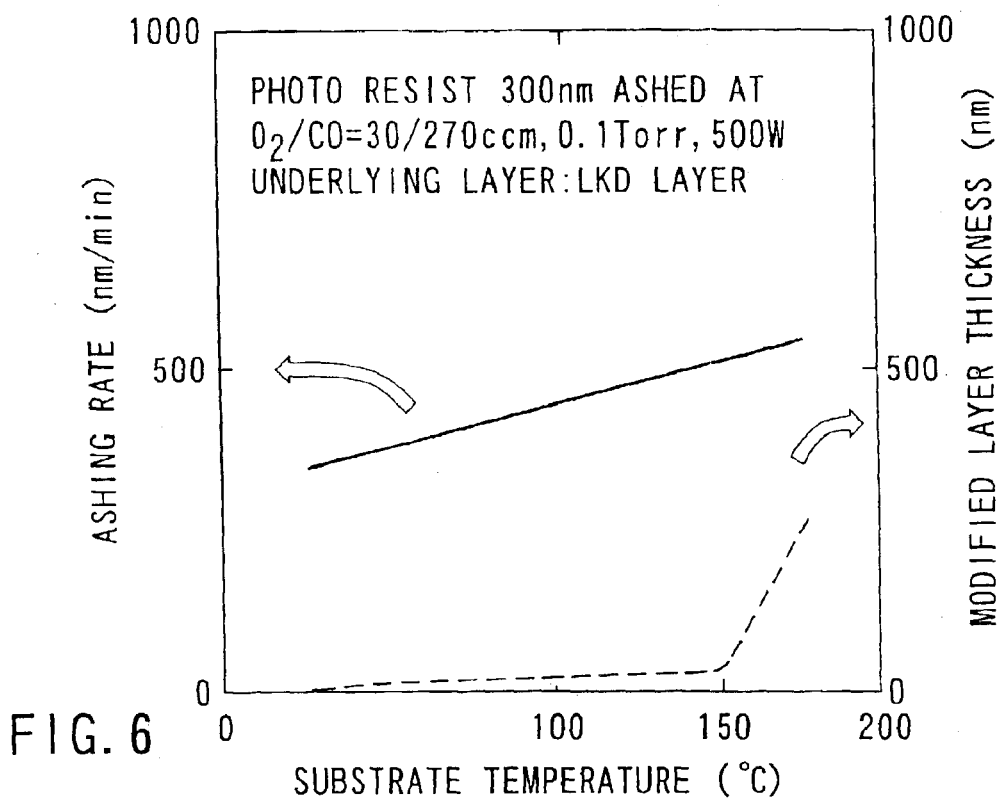
FIG. 6 is a characteristic diagram showing the relation between the photoresist ashing rate and the thickness of a modified layer on the side wall of the contact hole of the underlying layer at the time of ashing with respect to the substrate temperature in a case wherein oxygen and carbon monoxide are used as an ashing gas.

Further, as shown in FIG. 6, by effecting the plasma ashing process at 150° C. or less, removal of carbon atoms from the side wall of the LKD layer which is an underlying layer can be suppressed while the resist ashing rate is kept sufficiently high. In FIG. 6, the left side ordinate indicates the ashing rate (nm/min) of the photoresist, the right side ordinate indicates the thickness (nm) of the side wall modified layer of the LKD layer which is an underlying layer when the photoresist is ashed by 300 nm, and the abscissa indicates the etching temperature (° C.) of the semiconductor substrate. Further, the pressure at the time of ashing is 100 m Torr.

Figure 7:
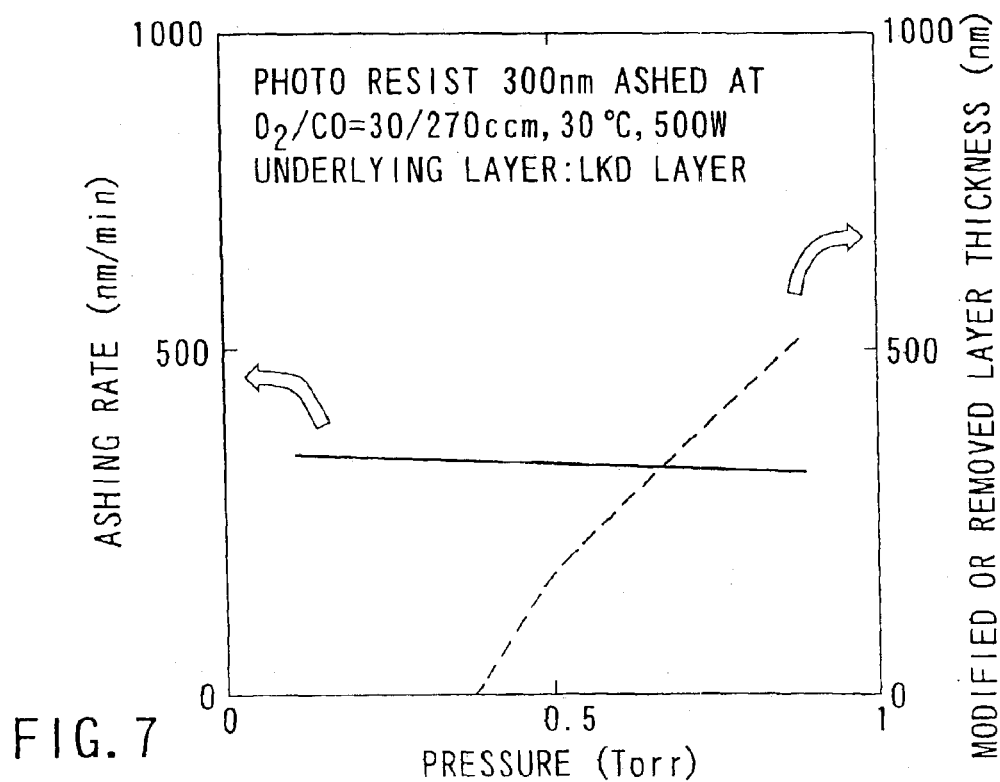
FIG. 7 is a characteristic diagram showing the relation between the photoresist ashing rate and the thickness of a modified layer on the side wall of the contact hole of the underlying layer at the time of ashing with respect to the gas pressure in a case wherein oxygen and carbon monoxide are used as an ashing gas.

As shown in FIG. 7, by effecting the process while setting the pressure at 400 m Torr or less, removal of carbon from the side wall of the LKD layer which is an underlying layer can be more effectively suppressed. In FIG. 7, the left side ordinate indicates the ashing rate (nm/min) of the photoresist, the right side ordinate indicates the thickness (nm) of the side wall modified layer of the LKD layer which is an underlying layer when the photoresist is ashed by 300 nm, and the abscissa indicates the pressure (Torr) at the time of ashing. Further, the temperature at the time of ashing is 30° C.

As described in the first embodiment, the layer (photoresist) containing carbon atoms and formed on the underlying layer can be efficiently dry-etched without etching the underlying layer containing carbon atoms by using a gas containing oxygen atoms and carbon atoms. Further, as shown in FIG. 3, it is clearly understood that the same effect can be attained even when only a CO gas is used without using an oxygen gas (that is, even when a CO gas is 100%).

Further, in the first embodiment, a case wherein a CO gas is used as an ashing gas is explained, but in this invention, as a gas containing carbon atoms, the following materials can be used by adequately controlling the pressure, temperature, power and the like. That is, it is possible to use $CO_2$, $C_5H_{12}$, $C_5H_{10}$, $C_4H_{10}$, $C_4H_8$, $C_4H_6$, $C_3H_9N$, $C_3H_8$, $C_3H_6O$, $C_3H_6$, $c_3H_4$, $C_2N_2$, $C_2H_7N$, $C_2H_6O$, $C_2H_6$, $C_2H_4O$, $C_2H_4$, $C_2H_2$, COS, $CH_5N$, $CH_4S$, $CH_4$, CHN and the like and a gas containing at least one of oxygen atoms, nitrogen atoms and hydrogen atoms in addition to carbon atoms is used.

(Second Embodiment)

Next, a second embodiment is explained with reference to FIGS. 8A to 8E. In the second embodiment, a case wherein a CF based layer 20 is formed as an LKD layer of an interlayer insulating layer by a CVD method is explained. The CF based layer may be formed by using a coating method.

Figure 8A:
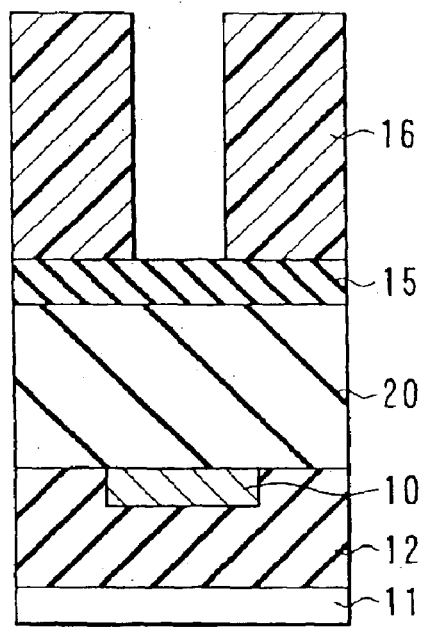
FIGS. 8A to 8E are cross sectional views of a semiconductor device showing the manufacturing method in the order of steps of manufacturing the semiconductor device according to a second embodiment of this invention.

First, an LKD layer 12 with a film thickness of 500 nm is formed by coating as an interlayer dielectric on a semiconductor substrate 11 formed of silicon semiconductor, for example. Then, a metal interconnection 10 formed of aluminum, for example, is buried in the surface portion of the LKD layer 12. An LKD layer 20 with a film thickness of 400 nm is formed as an interlayer dielectric on the LKD layer 12. The LKD layer 20 is a CF based CVD insulating layer. The layer forming condition at this time is $CF_4/O_2=$ 200/50 ccm, 1 Torr, 500 W, 400° C. and the LKD layer 20 is formed by microwave discharging. An organic based antireflection layer 15 with a film thickness 60 nm and a photoresist 16 with a film thickness 0.6 $\mu$m are formed by coating on the above layer. After this, the photoresist 16 is patterned by a lithography technique which is well known in the art (FIG. 8A).

Figure 8B:
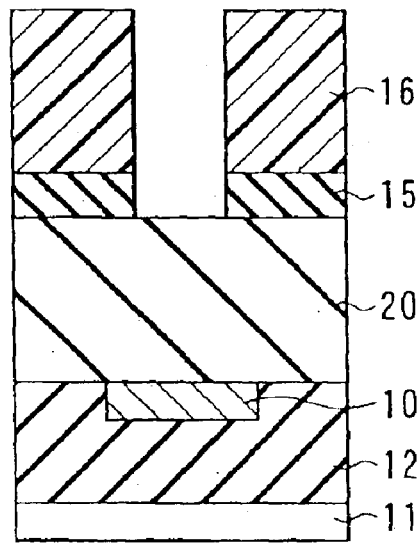
Figure 8C:
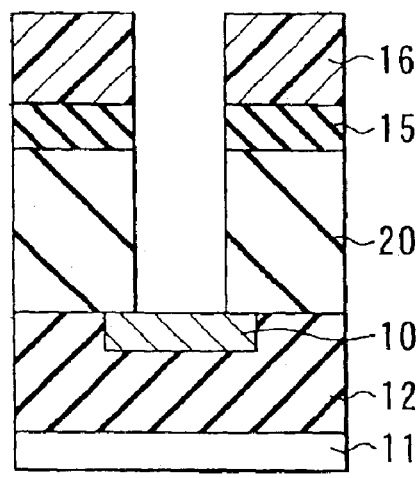

Next, the antireflection layer is processed with the patterned photoresist 16 used as a mask (FIG. 8B). Then, the LKD layer 20 is etched by an RIE method using a reactive gas of $C_4F_8/CO/O_2/Ar$ to form a contact hole with a depth of 400 nm and a pattern size of 0.2 $\mu$m. On the bottom surface of the contact hole, the metal interconnection 10 is exposed (FIG. 8C).

Figure 8D:
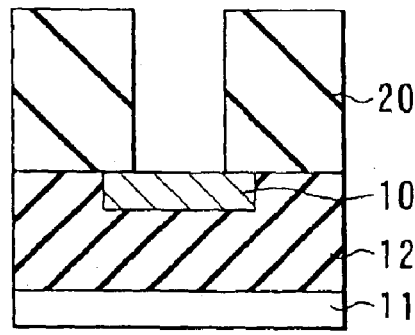

Next, portions of the photoresist 16 and antireflection layer 15 which are left behind on the LKD layer 20 are stripped by a plasma process using $O_2/CO$ in the same ashing condition as in the first embodiment (FIG. 8D).

After this, a TiN barrier metal layer 18 is formed to a film thickness of approximately 30 nm and an aluminum (Al) layer 19 is formed to a film thickness of approximately 700 nm by the sputtering method and filled in the contact hole.

Figure 8E:
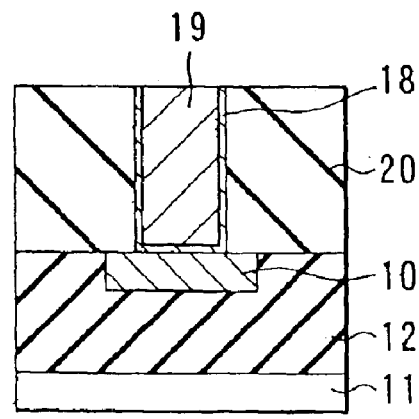

After this, the Al layer 19 is polished by a CMP method until the surface of the LKD layer is exposed. Thus, a contact interconnection of the aluminum layer 19 is formed in the contact hole. The contact interconnection is used for electrically connecting an upper layer interconnection (not shown) to the metal interconnection (lower layer interconnection) 10 (FIG. 8E).

Stripping of the photoresist after processing the LKD layer 20 of a CF based layer is effected by a plasma ashing process using an oxygen gas in the conventional method, but according to this method, there occurs a problem that the side surface of the LKD layer 20 of a CF based layer is side-etched at the same time as the upper portion thereof is etched and a CD bias occurs. This is because ion assisted etching of the photoresist due to an oxygen ion and oxygen radical occurs in the low pressure oxygen RIE process, an isotropic oxygen radical component enters the contact hole and a process for etching the interlayer dielectric 20 of a CF based layer proceeds from a portion which is in contact with the radical based gas. Further, since ions are dispersed in various directions other than the vertical direction, ion assisted etching occurs in the side wall.

As described above, in the second embodiment, the organic based antireflection layer and the layer (photoresist) containing carbon atoms and formed on the underlying layer can be efficiently ashed without etching the insulating layer containing carbon atoms and used as the underlying layer by using a gas containing carbon atoms or a gas containing oxygen atoms and carbon atoms. As shown in FIG. 3, the same effect can be attained even when only a CO gas is used without using an oxygen gas. In the second embodiment, a CF based layer is used as the insulating layers, but another organic layer can be used.

Further, in the second embodiment, a CO gas is used as ashing gas, but as a gas containing carbon atoms, the following materials can be used by adequately controlling the pressure, temperature, power and the like. That is, it is possible to use $CO_2$, $C_5H_{12}$, $C_5H_{10}$, $C_4H_{10}$, $C_4H_8$, $C_4H_6$, $C_3H_9N$, $C_3H_8$, $C_3H_6O$, $C_3H_6$, $C_3H_4$, $C_2N_2$, $C_2H_7N$, $C_2H_6O$, $C_2H_6$, $C_2H_4O$, $C_2H_4$, $C_2H_2$, COS, $CH_5N$, $CH_4S$, $CH_4$, CHN and the like and a gas containing at least one of oxygen atoms, nitrogen atoms and hydrogen atoms in addition to carbon atoms is used.

The metal interconnection is not limited to aluminum. For example, Al—Si—Cu, Al—Cu, W, WSi, Cu, Ag, Au or the like can be used. Further, this invention is not limited to the contact hole shown in the second embodiment and the same effect can be attained when interconnection grooves or other patterns are formed.

(Third Embodiment)

Next, a third embodiment is explained with reference to FIGS. 9A to 9K. In the third embodiment, a porous and relatively fragile inorganic based layer is used as an LKD layer of an interlayer dielectric. That is, an interconnection structure having a structure in which a carbon based layer is buried in the porous insulating layer which is used for forming a gas dielectric structure in the underlying layer is explained.

Figure 9A:
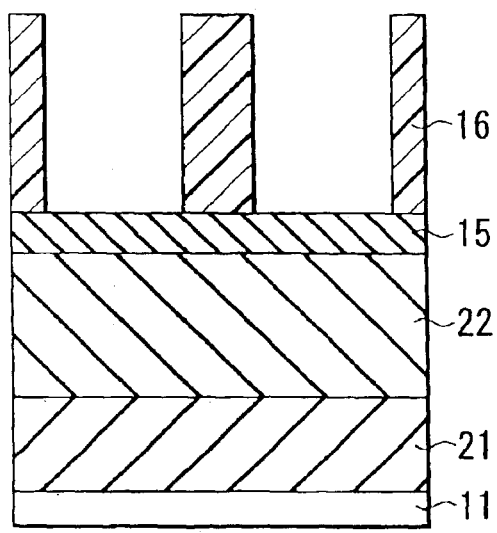
FIGS. 9A to 9K are cross sectional views of a semiconductor device showing the manufacturing method in the order of steps of manufacturing the semiconductor device according to a third embodiment of this invention.

A porous silicon oxide layer 22 is formed on a silicon nitride layer 21 with a film thickness 500 nm which is formed on a semiconductor substrate 11 by a CVD method. An organic based antireflection layer 15 with a film thickness 60 nm and a photoresist 16 with a film thickness 0.6 $\mu$m are formed by coating on the above-mentioned layer. After this, the photoresist 16 is patterned by a lithography technique which is well known in the art (FIG. 9A).

Figure 9B:
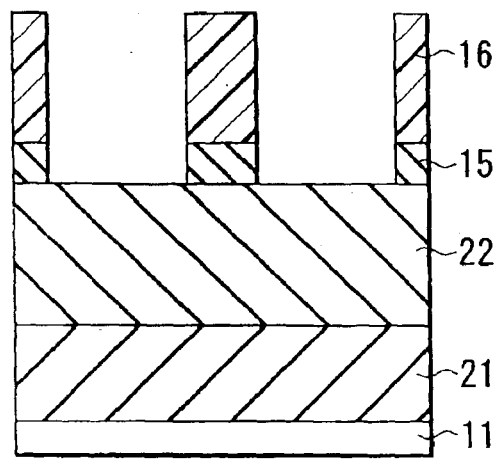
Figure 9C:
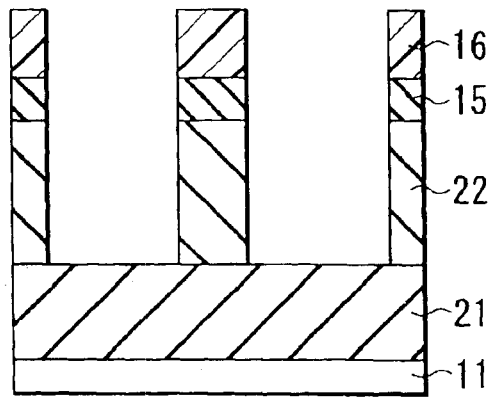

Next, the antireflection layer 15 is processed with the patterned photoresist used as a mask (FIG. 9B). Then, the porous silicon oxide layer 22 is etched by an RIE method using a gas of $C_4F_8/CO/O_2/Ar$ with the silicon nitride layer 21 used as an etching stopper to form interconnection grooves with a depth of 400 nm and a pattern size of 0.3 μm square at an interval of 0.3 μm (FIG. 9C).

Figure 9D:
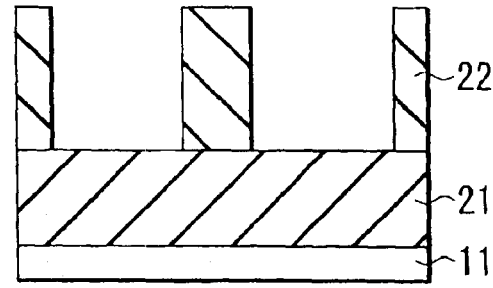

Next, portions of the photoresist 16 and antireflection layer 15 which are left behind on the porous silicon oxide layer 22 are stripped by oxygen downflow ashing (FIG. 9D). After this, a carbon layer 23 is formed to a film thickness of 700 nm by sputtering and filled in the grooves formed in the porous silicon oxide layer 22. The carbon layer is an extremely rigid or strong layer in comparison with the photoresist and antireflection layer and the carbon concentration thereof is two to three times that of the latter layers.

Figure 9E:
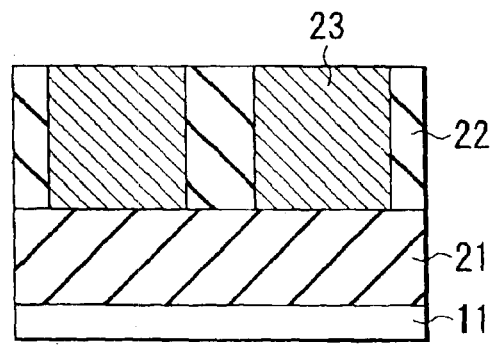

In this embodiment, the CVD method is used to form the porous silicon oxide layer 22, but a coating method can also be used instead thereof. After this, the carbon layer 23 is polished by a CMP method until the surface of the porous silicon oxide layer 22 is exposed (FIG. 9E).

Figure 9F:
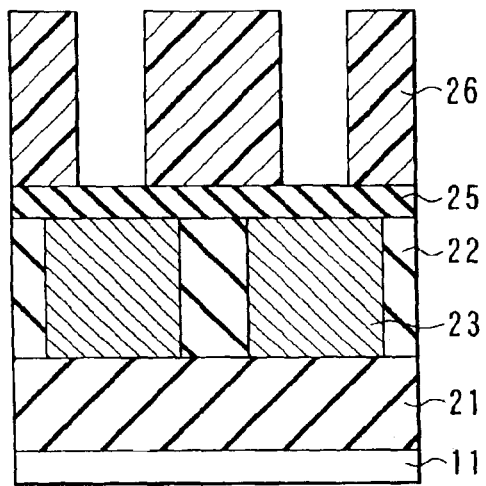

An antireflection layer 25 with a film thickness of 60 nm and a photoresist 26 with a film thickness of 0.6 μm are formed by coating on the porous silicon oxide layer 22 and carbon layer 23. After this, the photoresist 26 is patterned by a lithography technique which is well known in the art (FIG. 9F).

Figure 9I:
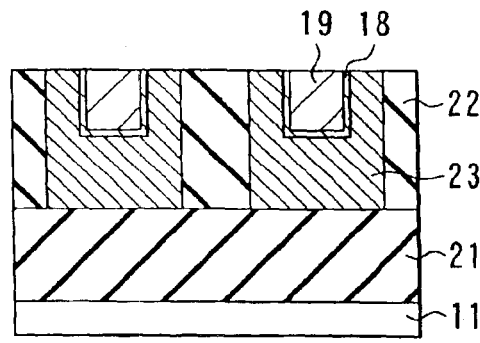
Figure 9G:
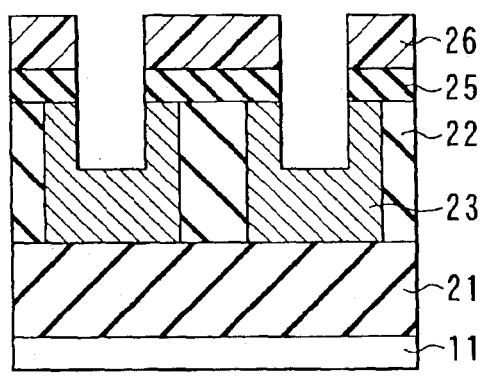

After the antireflection layer is processed with the photoresist 26 used as a mask, the underlying carbon layer 23 is etched by an RIE method using a gas of $C_4F_8/CO/O_2/Ar$ to form interconnection grooves 24 with a depth of 200 nm and a pattern size of 0.2 μm (FIG. 9G). Further, portions of the photoresist 26 and antireflection layer 25 which are left behind on the porous silicon oxide layer 22 are stripped by an ashing process (FIG. 9H).

After this, a TiN barrier metal layer 18 is formed to a film thickness of approximately 30 nm on the inner wall of interconnection grooves 23' and then an aluminum (Al) layer 19 is formed to a film thickness of 700 nm by sputtering and filled in the interconnection grooves 23'. Then, the Al layer 19 is polished by a CMP method until the surface of the porous silicon oxide layer 22 is exposed. As a result, the Al layer 19 used as contact interconnections is formed and buried in the carbon layer 23 (FIG. 9I).

Figure 9J:
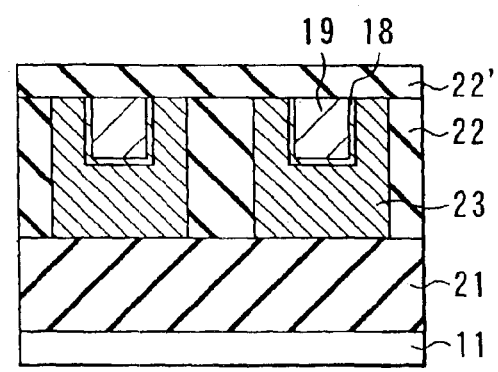
Figure 9H:
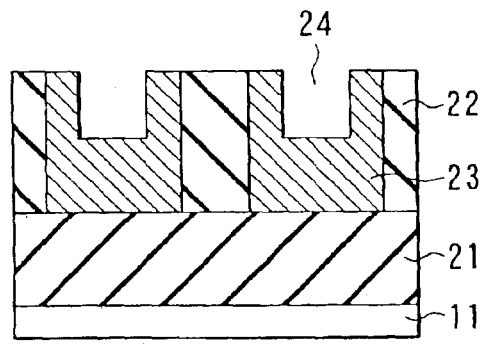
Figure 9K:
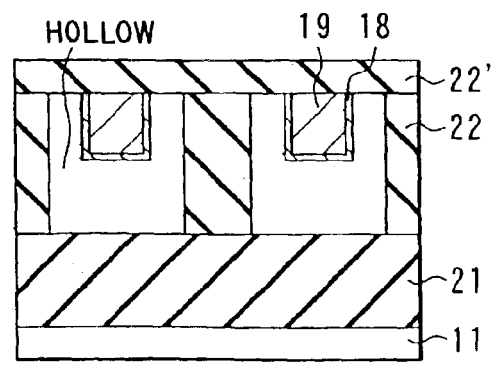

After this, a porous silicon oxide layer 22' with a film thickness of 100 nm is formed by a CVD method, for example, to cover the Al layers 19 buried in the respective carbon layers 23 (FIG. 9J). Then, the carbon layer 23 in the porous silicon oxide layer 22 which is an underlying layer of the porous silicon oxide layer 22' is etched by oxygen downflow ashing. As a result, midair interconnections formed of the Al layers 19 covered with the porous silicon oxide layer 22' and arranged in the grooves of the porous silicon oxide layer 22 in which the carbon layers 23 have been buried are formed. If the carbon layer 23 is ashed, carbon becomes carbon dioxide gas and is dispersed through the porous portions of the porous silicon oxide layers 22 and 22' to the exterior to make hollows around the TiN barrier metal layers 18 and Al layers 19. In the semiconductor device explained in the third embodiment, a plurality of interconnection grooves as described above are formed and the dielectric constant of the interlayer dielectric is further lowered (FIG. 9K).

In a process for stripping portions of the photoresist 26 and antireflection layer 25 which are left behind on the porous silicon oxide layer 22 by the plasma process after the interconnection grooves 23' are formed in the carbon layers 23, there occurs a problem in the conventional method that the carbon layer 23 formed in the porous silicon oxide layer 22 which is the underlying layer is etched. This is because the porous silicon oxide layer 22 may permit the oxidation radical to freely pass therethrough and, as a result, there occurs a problem that the CD bias occurs.

Therefore, the third embodiment has a feature that the process for stripping portions of the photoresist 26 and antireflection layer 25 which are left behind on the porous silicon oxide layer 22 by the plasma process after formation of the interconnection grooves is effected by a plasma process using a gas containing carbon atoms or a gas containing oxygen atoms and carbon atoms. The ashing device is of a parallel plate type shown in FIG. 2 and the ashing condition is $O_2/CO=100/200$ ccm, 100 m Torr, 500 W and 30° C. In this condition, the process for stripping the photoresist 26 proceeds, and since etching of the carbon layer 23 can be suppressed, occurrence of the CD bias can be prevented.

Thus, the effect of suppressing the side etching of grooves formed in the underlying layer containing carbon atoms is particularly high in a region in which the percentage of carbon atoms is higher than ⅓ of the percentage of oxygen atoms in a gas containing carbon atoms or a process gas containing oxygen atoms and carbon atoms. Further, the side etching can be suppressed while a sufficiently high etching rate is kept by effecting the process at 150° C. or less by the RIE method. The side etching can be more effectively suppressed by effecting the process at 400 m Torr or less.

The metal interconnection is not limited to aluminum. For example, Al—Si—Cu, Al—Cu, W, WSi, Cu, Ag, Au or the like can be used.

Further, in the above embodiment, a CO gas is used as the ashing gas, but as a gas containing carbon atoms, the following materials can be used by adequately controlling the pressure, temperature, power and the like. That is, it is possible to use $CO_2$, $C_5H_{12}$, $C_5H_{10}$, $C_4H_{10}$, $C_4H_8$, $C_4H_6$, $C_3H_9N$, $C_3H_8$, $C_3H_6O$, $C_3H_6$, $C_3H_4$, $C_2N_2$, $C_2H_7N$, $C_2H_6O$, $C_2H_6$, $C_2H_4O$, $C_2H_4$, $C_2H_2$, COS, $CH_5N$, $CH_5N$, $CH_4S$, $CH_4$, CHN and the like and a gas containing at least one of oxygen atoms, nitrogen atoms and hydrogen atoms in addition to carbon atoms is used. In this embodiment, a case of the interconnection grooves is explained, but the same effect can be attained when contact holes or other patterns are formed.

Further, the parallel plate ashing device is used for the plasma process, but another type of plasma ashing device can be used. Further, for example, a downflow asher device can be used by adequately controlling the pressure, temperature and power.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A dry etching method, comprising:
    sequentially laminating a first insulating layer containing carbon and a second insulating layer containing carbon on a substrate;
    patterning the second insulating layer to form a mask;
    forming grooves in the first insulating layer by etching the first insulating layer with the second insulating layer used as a mask such that each of the grooves has a side surface and a bottom surface in the first insulating layer; and
    removing the second insulating layer by use of a reactive gas containing carbon atoms and at least one of oxygen atoms, hydrogen atoms, and nitrogen atoms.

2. The dry etching method according to claim 1, wherein the first insulating layer containing carbon atoms is one selected from the group consisting of a carbon layer, an organic silicon compound layer, and an organic layer.

3. The dry etching method according to claim 1, wherein the second insulating layer containing carbon is a photoresist.

4. The dry etching method according to claim 1, wherein the second insulating layer containing carbon is an organic antireflection layer.

5. The dry etching method according to claim 1, wherein an atomic percentage of carbon is not less than 1/3 of that of oxygen in a gas containing carbon atoms and oxygen atoms among the gas containing carbon atoms and at least one of oxygen atoms, hydrogen atoms, and nitrogen atoms.

6. The dry etching method according to claim 5, wherein a gas selected from the group consisting of a gas containing oxygen and carbon dioxide, a gas containing oxygen and carbon monoxide, a carbon monoxide gas, and a carbon dioxide gas, is used as the gas containing oxygen atoms and carbon atoms.

7. The dry etching method according to claim 1, wherein said removing the second insulating layer includes setting the substrate temperature to not higher than 150° C.

8. The dry etching method according to claim 1, wherein said removing the second insulating layer includes setting the reaction pressure to not higher than 400 m Torr.

9. A semiconductor device manufacturing method, comprising:
sequentially laminating an insulating layer and a photoresist each containing carbon on a semiconductor substrate;
patterning the photoresist to form a mask;
forming interconnection grooves in the insulating layer by etching the insulating layer with the photoresist used as a mask, such that each of the interconnection grooves has a side surface and a bottom surface in the insulating layer;
ashing and removing the photoresist by use of a gas containing carbon atoms and at least one of oxygen atoms, hydrogen atoms, and nitrogen atoms; and
depositing a metal interconnection layer in the interconnection grooves to form interconnections therein.

10. The semiconductor device manufacturing method according to claim 9, wherein the insulating layer containing carbon is one of an organic silicon compound layer and an insulating layer of low dielectric constant containing carbon atoms.

11. The semiconductor device manufacturing method according to claim 9, wherein an atomic percentage of carbon is not less than 1/3 of that of oxygen in a gas containing carbon atoms and oxygen atoms among the gas containing carbon atoms and at least one of oxygen atoms, hydrogen atoms, and nitrogen atoms.

12. The semiconductor device manufacturing method according to claim 9, wherein a gas selected from the group consisting of a gas containing oxygen sad carbon dioxide, a gas containing oxygen and carbon monoxide, a carbon monoxide gas, and a carbon dioxide gas, is used as the gas containing oxygen atoms and carbon atoms.

13. The semiconductor device manufacturing method according to claim 9, wherein said removing the second insulating layer includes setting the substrate temperature to not higher than 150° C.

14. The semiconductor device manufacturing method according to claim 9, wherein said removing the second insulating layer includes setting the reaction pressure to not higher than 400 m Torr.

15. A semiconductor device manufacturing method, comprising:
sequentially laminating an insulating layer and a first photoresist on a semiconductor substrate;
patterning the first photoresist to form a mask;
forming first interconnection grooves by etching the insulating layer with the first photoresist used as a mask;
ashing and removing the first photoresist by use of a gas containing carbon atoms and at least one of oxygen atoms, hydrogen atoms, and nitrogen atoms;
burying a carbon layer in the first interconnection grooves;
laminating a second photoresist on the insulating layer to cover the carbon layer;
patterning the second photoresist to form a mask;
forming second interconnection grooves by etching the carbon layer with the second photoresist used as a mask, such that each of the second interconnection grooves has a side surface and a bottom surface in the carbon layer;
ashing and removing the second photoresist by use of a gas containing carbon atoms and at least one of oxygen atoms, hydrogen atoms, and nitrogen atoms;
depositing a metal interconnection layer in the second interconnection grooves to bury interconnections therein;
forming a porous silicon oxide layer on the interlayer insulating layer to cover the interconnections and the carbon layer; and
heating the carbon layer to remove the same from the interconnection grooves and provide a hollow around each of the interconnections.

16. The semiconductor device manufacturing method according to claim 15, wherein at least one of said sequentially laminating an insulating layer and a first photoresist on a semiconductor substrate and said laminating a second photoresist on the insulating layer to cover the carbon layer further includes forming an antireflection layer between the insulating layer and a corresponding one of the first and the second photoresist.

17. The semiconductor device manufacturing method according to claim 15, wherein an atomic percentage of carbon is not less than 1/3 of that of oxygen in a gas containing oxygen atoms and carbon atoms among the gas containing carbon atoms and at least one of oxygen atoms, hydrogen atoms, and nitrogen atoms.

18. The semiconductor device manufacturing method according to claim 15, wherein a gas selected from the group consisting of a gas containing oxygen and carbon dioxide, a gas containing oxygen and carbon monoxide, a carbon monoxide gas, and a carbon dioxide gas, is used as the gas containing oxygen atoms and carbon atoms.

19. The semiconductor device manufacturing method according to claim 15, wherein said ashing and removing the photoresist includes setting the substrate temperature to not higher than 150° C.

20. The semiconductor device manufacturing method according to claim 15, wherein said ashing and removing the photoresist includes setting the reaction pressure to not higher than 400 m Torr.

* * * * *